United States Patent
Chen et al.

(10) Patent No.: US 7,391,672 B1
(45) Date of Patent: Jun. 24, 2008

(54) SEQUENTIAL MEMORY AND ACCESSING METHOD THEREOF

(75) Inventors: Chang-Ting Chen, Hsinchu (TW); Chung-Kuang Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/645,708

(22) Filed: Dec. 27, 2006

(51) Int. Cl.
*G11C 7/00* (2006.01)
(52) U.S. Cl. ........................... 365/239; 365/203
(58) Field of Classification Search .............. 365/239, 365/203
See application file for complete search history.

(56) References Cited

U.S. PATENT DOCUMENTS

| | | | |
|---|---|---|---|
| 2003/0156440 A1* | 8/2003 | Hata et al. | 365/49 |
| 2004/0022109 A1* | 2/2004 | Yoon et al. | 365/205 |
| 2005/0237088 A1* | 10/2005 | Burleson et al. | 327/51 |

* cited by examiner

*Primary Examiner*—Michael T Tran
(74) *Attorney, Agent, or Firm*—Birch, Stewart, Kolasch & Birch, LLP

(57) ABSTRACT

A method for accessing a memory sequentially. The memory has (m+1) bit lines and at least one row of transistors, wherein m is a positive integer. This method includes the following steps. First, voltage levels of first and second terminals of the transistors are equalized to a ground voltage in a pre-discharge period. Next, the voltage levels of the first and second terminals of the $n^{th}$ transistor are respectively transformed into a source voltage and a drain voltage in an $n^{th}$ reading period, and the voltage level of the second terminal of the $(n+1)^{th}$ transistor is transformed into an isolation voltage, wherein n is a positive integer smaller than m. Thereafter, the voltage levels of the first and second terminals of the $m^{th}$ transistor are respectively transformed into the source voltage and the drain voltage in an $m^{th}$ reading period. The source voltage equals the ground voltage.

30 Claims, 8 Drawing Sheets

FIG. 6

| Period | GND | 201 | GND | 202 | GND | 203 | GND | 204 | GND | ... | GND | 20m-2 | GND | 20m-1 | GND | 20m | GND |
|---|---|---|---|---|---|---|---|---|---|---|---|---|---|---|---|---|---|
| Pre-discharge period | GND | | GND | | GND | | GND | | GND | ... | GND | | GND | | GND | | GND |
| First reading period | S | | D | | GND | | GND | | GND | ... | GND | | GND | | GND | | GND |
| Second reading period | GND | | S | | D | | ISO | | GND | ... | GND | | GND | | GND | | GND |
| ... | ... | | ... | | ... | | ... | | ... | ... | ... | | ... | | ... | | ... |
| mth reading period | GND | | GND | | GND | | GND | | GND | ... | D | | S | | GND | | GND |
| Middle-discharge period | GND | | GND | | GND | | GND | | GND | ... | GND | | GND | | GND | | GND |
| First inverse reading period | GND | | GND | | GND | | GND | | GND | ... | GND | | ISO | | D | | S |
| ... | ... | | ... | | ... | | ... | | ... | ... | ... | | ... | | ... | | ... |
| mth program period | D | | S | | GND | | GND | | GND | ... | GND | | GND | | GND | | GND |
| Discharge period | GND | | GND | | GND | | GND | | GND | ... | GND | | GND | | GND | | GND |

SEQUENTIAL MEMORY AND ACCESSING METHOD THEREOF

BACKGROUND OF THE INVENTION

1. Field of the Invention

The invention relates in general to a sequential memory and an accessing method thereof, and more particularly to a sequential memory and an accessing method thereof capable of saving the operation time and reducing the operation power.

2. Description of the Related Art

Memories have been currently used in the field of data storage widely. The memory has a plurality of memory cells disposed in an array usually. Each row of memory cells corresponds to one word line, and each column of memory cells corresponds to one bit line. Each memory cell includes a transistor, which has a first terminal coupled to a bit line, a second terminal coupled to another bit line, and a control terminal coupled to a corresponding word line.

The conventional memory operates in several steps, which usually include a charge step, a sense step and a discharge step. The discharge step is very important. If no discharge step is performed to clear the residual charges in the previous access period, initial voltages of the first terminal and the second terminal of the transistor may be different from each other in the current access period. In addition, the memory cell may have the residual charges after being read or programmed, thereby causing the leakage current or other unpredictable errors.

FIG. 1 shows a timing chart when a conventional memory is being read. As shown in the example of FIG. 1, an $n^{th}$ memory cell in a row of memory cells is read, wherein n is a positive integer. Usually, before the memory operates, a pre-discharge period (not shown), in which voltage levels of first terminals and second terminals of transistors in all the memory cells are pulled down to a low level voltage (i.e., a ground voltage), exists.

When the data stored in the $n^{th}$ memory cell is read, that is, in the $n^{th}$ reading period Tn, a bit line timing control bl_clk of a bit line corresponding to the $n^{th}$ memory cell has a low level voltage between the time instants t0 and t1 and the $n^{th}$ memory cell does not operate, and then has a high level voltage between the time instants t1 and t4, and the $n^{th}$ memory cell is being accessed.

In the charge period from the time instants t1 to t2, the bit line (drain side) of the $n^{th}$ memory cell is charged, and the voltage level of the charge pulse "charge" is transformed into the high level voltage. Next, in the sense period from the time instants t2 to t3, the $n^{th}$ memory cell is sensed (data evaluation), and the voltage level of a sense pulse sa_en is transformed into the high level voltage. Thereafter, in the discharge period from the time instants t3 to t4, the bit line of the $n^{th}$ memory cell is discharged, and the voltage level of a discharge pulse "discharge" is transformed into the high level voltage.

In addition, when the conventional memory is operating, it is also possible to perform the discharge operation followed by the charge and sense operations. If one row of memories has m memory cells, m discharge periods are required to read/program the row of memories. When the memory is being verified and if the verification error occurs, the m discharge periods have to be spent to read or program the memories again, thereby wasting a lot of time and disabling memories from operating at the high speed. In the meanwhile the memory operation power consumption raises substantially.

In addition, when the number of memory cells corresponding to the same bit line increases, the overall capacitance of the bit line also increases. Consequently, the discharge period (i.e., the time instants t3 to t4 in FIG. 1) of the memory cells increases, and the time of reading/programming the memory cells is thus lengthened, thereby wasting a longer period of operation time. Besides, when the number of memory cells corresponding to the same bit line increases, the currents we need to charge the overall capacitance on the bit line also increase, thereby wasting more power consumption.

SUMMARY OF THE INVENTION

It is therefore an object of the invention to provide a sequential memory and an accessing method thereof, wherein the smart method prevents the discharge period from being spent in the access period when the memory cells in the sequential memory are accessed, the memory can operate at a high speed, the operation time can be shortened, and the operation power can be reduced.

The invention achieves the above-identified object by providing a method of sequentially accessing a memory having (m+1) bit lines and at least one row of transistors, wherein m is a positive integer. The at least one row of transistors includes m transistors, the $x^{th}$ transistor has a first terminal coupled to the $x^{th}$ bit line and a second terminal coupled to the $(x+1)^{th}$ bit line, and x is a positive integer smaller than or equal to m. The method includes the following steps. First, voltage levels of the first terminals and the second terminals of the transistors are equalized to a ground voltage in a pre-discharge period. Next, the voltage level of the first terminal of the $n^{th}$ transistor is transformed into a source voltage, the voltage level of the second terminal of the $n^{th}$ transistor is transformed into a drain voltage, and the voltage level of the second terminal of the $(n+1)^{th}$ transistor is transformed into an isolation voltage in an $n^{th}$ reading period, wherein n is a positive integer smaller than m. Then, the voltage level of the first terminal of the $m^{th}$ transistor is transformed into the source voltage, and the voltage level of the second terminal of the $m^{th}$ transistor is transformed into the drain voltage in an $m^{th}$ reading period. The source voltage is equal to the ground voltage.

The invention also achieves the above-identified object by providing a sequential memory including (m+1) bit lines and at least one row of transistors, wherein m is a positive integer. The row of memory cells has m memory cells, each of which has a transistor. The $x^{th}$ transistor has a first terminal coupled to the $x^{th}$ bit line and a second terminal coupled to the $(x+1)^{th}$ bit line, and x is a positive integer smaller than or equal to m. Voltage levels of the first terminals and the second terminals of the transistors are equalized to a ground voltage in a pre-discharge period. The voltage level of the first terminal of the $n^{th}$ transistor is transformed into a source voltage, the voltage level of the second terminal of the $n^{th}$ transistor is transformed into a drain voltage, and the voltage level of the second terminal of the $(n+1)^{th}$ transistor is transformed into an isolation voltage in an $n^{th}$ reading period, wherein n is a positive integer smaller than m. The voltage level of the first terminal of the $m^{th}$ transistor is transformed into the source voltage, and the voltage level of the second terminal of the $m^{th}$ transistor is transformed into the drain voltage in an $m^{th}$ reading period. The source voltage is equal to the ground voltage.

The invention also achieves the above-identified object by providing a method for sequentially accessing a memory having (m+1) bit lines and at least one row of transistors, wherein m is a positive integer. The at least one row of transistors has m transistors. The $x^{th}$ transistor has a first terminal coupled to the $x^{th}$ bit line and a second terminal coupled to the $(x+1)^{th}$ bit line, and x is a positive integer smaller than or equal to m. The method includes the following steps. First, voltage levels of the first terminals and the second terminals of the transistors are equalized to a ground voltage in a pre-discharge period. Next, the voltage level of the second terminal of the $(m-n+1)^{th}$ transistor is transformed into a source voltage, the voltage level of the first terminal of the $(m-n+1)^{th}$ transistor is transformed into a drain voltage, and the voltage level of the first terminal of the $(m-n)^{th}$ transistor is transformed into an isolation voltage in an $n^{th}$ program period, wherein n is a positive integer smaller than m. The voltage level of the second terminal of the first transistor is transformed into the source voltage and the voltage level of the first terminal of the first transistor is transformed into the drain voltage in an $m^{th}$ program period. The source voltage is equal to the ground voltage.

The invention also achieves the above-identified object by providing a sequential memory including (m+1) bit lines and at least one row of memory cells, wherein m is a positive integer. The at least one row of memory cells has m memory cells, each of which has a transistor. A first terminal of the $x^{th}$ transistor is coupled to the $x^{th}$ bit line, a second terminal of the $x^{th}$ transistor is coupled to the $(x+1)^{th}$ bit line, and x is a positive integer smaller than or equal to m. Voltage levels of the first terminals and the second terminals of the transistors are equalized to a ground voltage in a pre-discharge period. The voltage level of the second terminal of the $(m-n+1)^{th}$ transistor is transformed into a source voltage, the voltage level of the first terminal of the $(m-n+1)^{th}$ transistor is transformed into a drain voltage, and the voltage level of the first terminal of the $(m-n)^{th}$ transistor is transformed into an isolation voltage in an $n^{th}$ program period, wherein n is a positive integer smaller than m. The voltage level of the second terminal of the first transistor is transformed into the source voltage, and the voltage level of the first terminal of the first transistor is transformed into the drain voltage in an $m^{th}$ reading period. The source voltage is equal to the ground voltage.

The invention also achieves the above-identified object by providing a method for sequentially accessing a memory having (m+1) bit lines and at least one row of transistors, wherein m is a positive integer. The at least one row of transistors comprises m transistors. The $x^{th}$ transistor has a first terminal coupled to the $x^{th}$ bit line and a second terminal coupled to the $(x+1)^{th}$ bit line, and x is a positive integer smaller than or equal to m. The $x^{th}$ transistor has a first bit and a second bit. The method includes the following steps. First, voltage levels of the first terminals and the second terminals of the transistors are equalized to a ground voltage in a pre-discharge period. Next, the voltage level of the first terminal of the $n^{th}$ transistor is transformed into a source voltage, the voltage level of the second terminal of the $n^{th}$ transistor is transformed into a drain voltage, and the voltage level of the second terminal of the $(n+1)^{th}$ transistor is transformed into an isolation voltage in an $n^{th}$ reading period, wherein n is a positive integer smaller than m. The voltage level of the first terminal of the $m^{th}$ transistor is transformed into the source voltage, and the voltage level of the second terminal of the $m^{th}$ transistor is transformed into the drain voltage in an $m^{th}$ reading period. Then voltage levels of the first terminals and the second terminals of the transistors are equalized to the ground voltage in a middle-discharge period. Afterwards the voltage level of the second terminal of the $(m-n+1)^{th}$ transistor is transformed into the source voltage, the voltage level of the first terminal of the $(m-n+1)^{th}$ transistor is transformed into the drain voltage, and the voltage level of the first terminal of the $(m-n)^{th}$ transistor is transformed into the isolation voltage in an $n^{th}$ inverse reading period. Next, the voltage level of the second terminal of the first transistor is transformed into the source voltage and the voltage level of the first terminal of the first transistor is transformed into the drain voltage in an $m^{th}$ inverse reading period. The source voltage is equal to the ground voltage.

The invention also achieves the above-identified object by providing a method for sequentially accessing a memory having (m+1) bit lines and at least one row of transistors, wherein m is a positive integer. The at least one row of transistors comprises m transistors. The $x^{th}$ transistor has a first terminal coupled to the $x^{th}$ bit line and a second terminal coupled to the $(x+1)^{th}$ bit line, and x is a positive integer smaller than or equal to m. The $x^{th}$ transistor has a first bit and a second bit. The method includes the following steps. First, voltage levels of the first terminals and the second terminals of the transistors are equalized to a ground voltage in a pre-discharge period. Next, the voltage level of the second terminal of the $(m-n+1)^{th}$ transistor is transformed into a source voltage, the voltage level of the first terminal of the $(m-n+1)^{th}$ transistor is transformed into a drain voltage, and the voltage level of the first terminal of the $(m-n)^{th}$ transistor is transformed into an isolation voltage in an $n^{th}$ program period. The voltage level of the second terminal of the first transistor is transformed into the source voltage and the voltage level of the first terminal of the first transistor is transformed into the drain voltage in an $m^{th}$ program period, wherein n is a positive integer smaller than m. Afterwards voltage levels of the first terminals and the second terminals of the transistors are equalized to the ground voltage in a middle-discharge period. Then the voltage level of the first terminal of the $n^{th}$ transistor is transformed into the source voltage, the voltage level of the second terminal of the $n^{th}$ transistor is transformed into the drain voltage, and the voltage level of the second terminal of the $(n+1)^{th}$ transistor is transformed into the isolation voltage in an $n^{th}$ inverse program period. The voltage level of the first terminal of the $m^{th}$ transistor is transformed into the source voltage, and the voltage level of the second terminal of the $m^{th}$ transistor is transformed into the drain voltage in an $m^{th}$ inverse program period. The source voltage is equal to the ground voltage.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 6 shows states in another example of the method for sequentially accessing the memory cells $20x$ (x=1 to m) according to the preferred embodiment of the invention.

DETAILED DESCRIPTION OF THE INVENTION

The invention provides a sequential memory and an accessing method thereof capable of preventing the discharge period from being spent in the access period when the memory cells in the sequential memory are accessed. Thus, the memory can operate at a high speed, the operation time can be shortened, and the operation power can be reduced.

Figure 1:
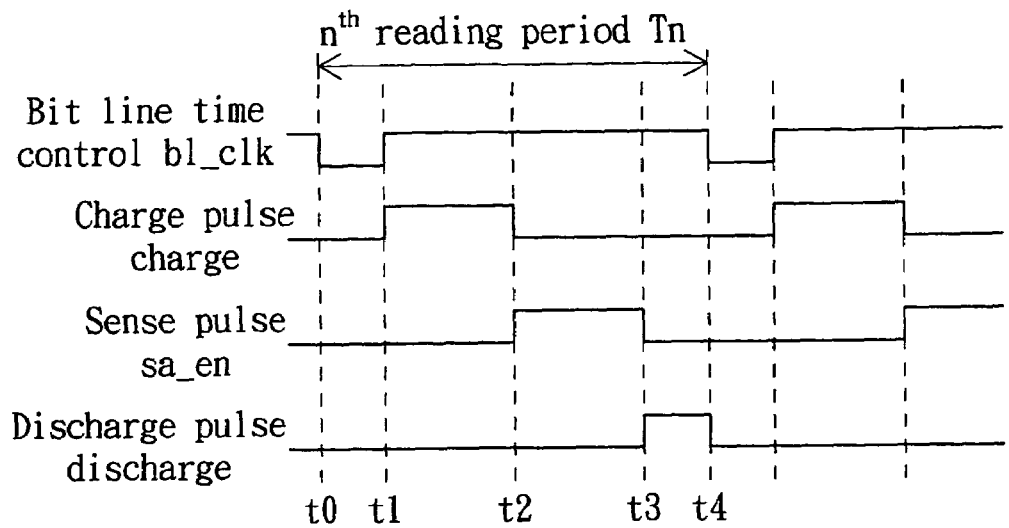
FIG. 1 (Prior Art) shows a timing chart when a conventional memory is being read.
Figure 2:
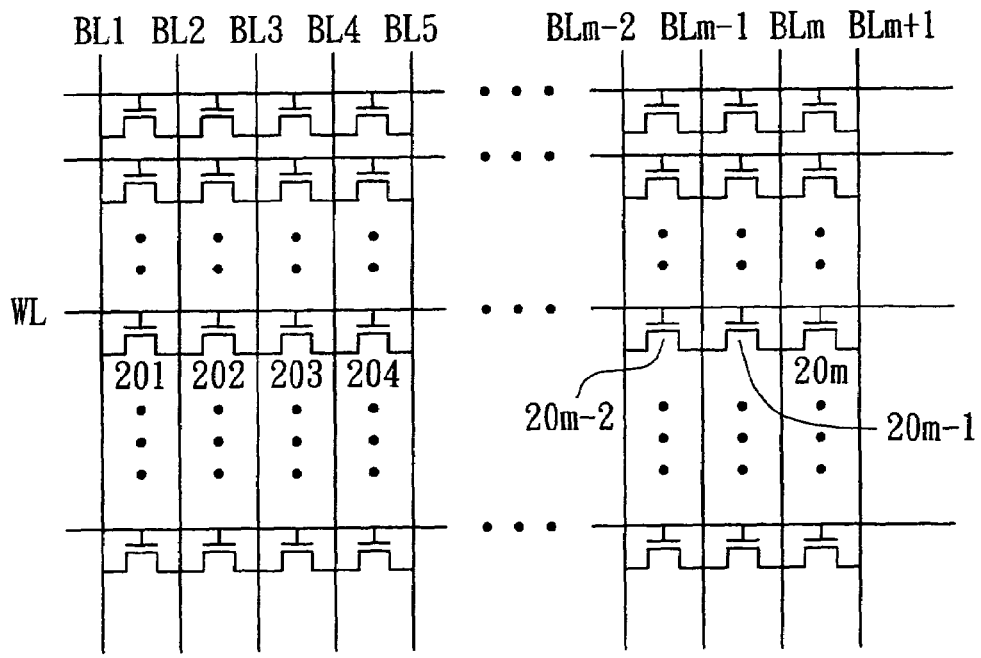
FIG. 2 is a schematic illustration showing a sequential memory according to a preferred embodiment of the invention.

FIG. 2 is a schematic illustration showing a sequential memory according to a preferred embodiment of the invention. Referring to FIG. 2, a sequential memory 200 includes (m+1) bit lines BL1 to BL(m+1) and a plurality of memory cells arranged in an array. The memory cells include at least one row of memory cells 201 to 20$m$, wherein m is a positive integer. Each of the memory cells 201 to 20$m$ has a transistor, for example a floating gate field effect transistor without limitation. The transistor of the memory cell 20$x$ has a first terminal coupled to the $x^{th}$ bit line BL$x$, and a second terminal coupled to the $(x+1)^{th}$ bit line BL$(x+1)$, wherein x is a positive integer smaller than or equal to m.

Figure 3:
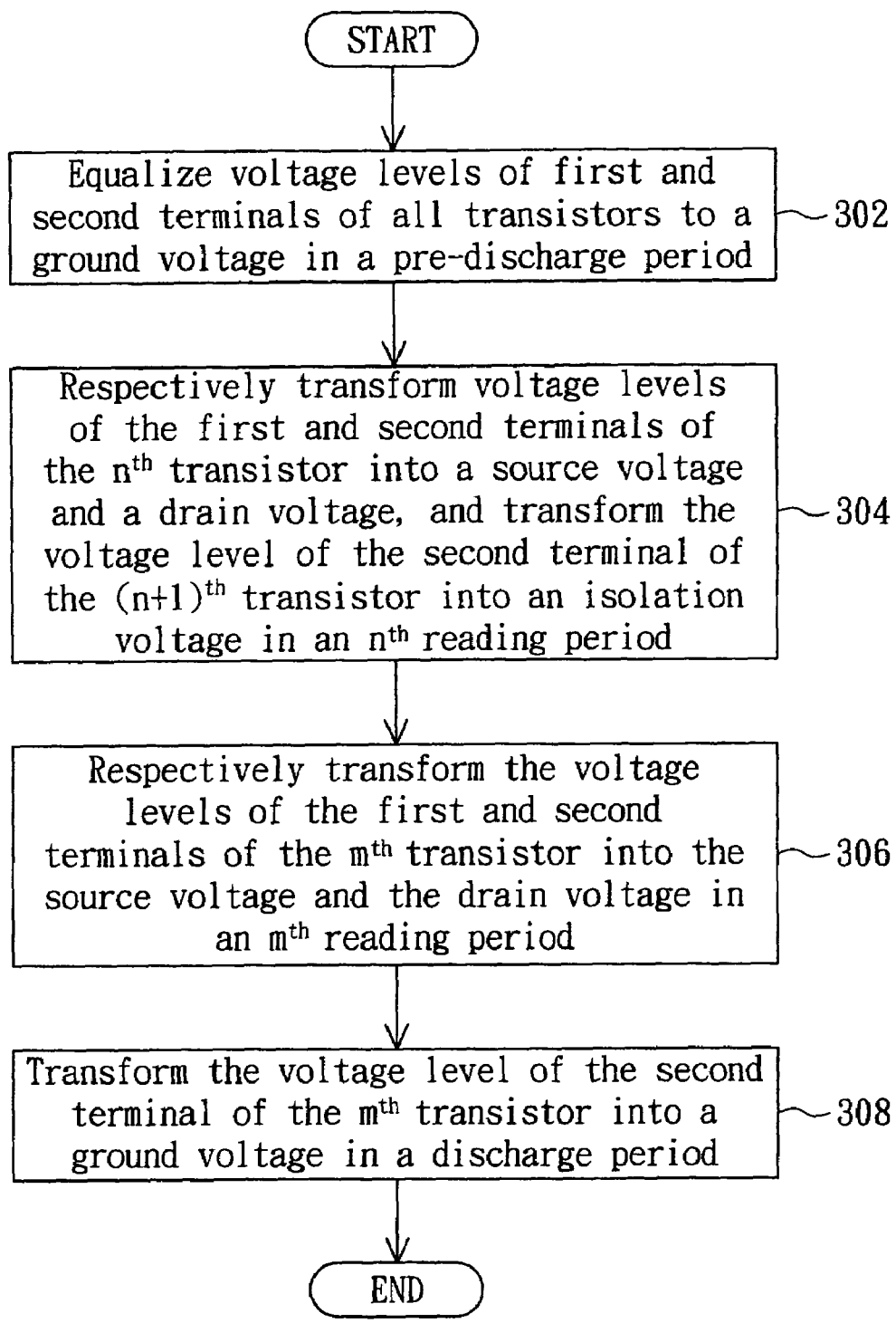
FIG. 3 is a flow chart showing a method for sequentially accessing the memory according to the preferred embodiment of the invention.
Figure 4:
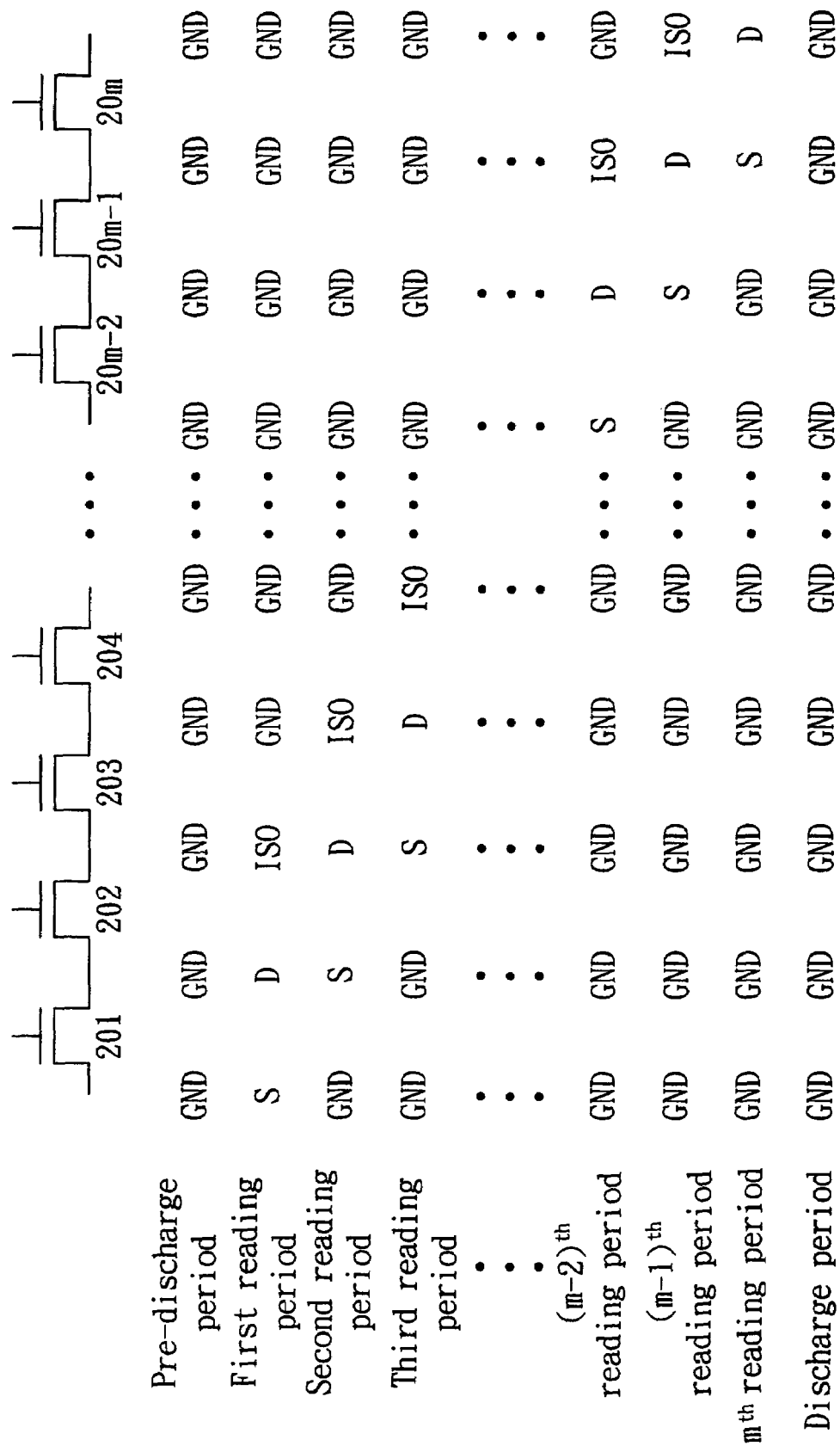
FIG. 4 shows states in one example of the method for sequentially accessing memory cells $20x$ (x=1 to m) according to the preferred embodiment of the invention.

FIG. 3 is a flow chart showing a method for sequentially accessing the memory according to the preferred embodiment of the invention. FIG. 4 shows states in one example of the method for sequentially accessing memory cells 20$x$ ($x$=1 to m) according to the preferred embodiment of the invention. Referring to FIG. 3, the method includes the following steps. First, step 302 equalizes voltage levels of the first terminals and the second terminals in the memory cells 20$x$ ($x$=1 to m) to a ground voltage GND in a pre-discharge period. As correspondingly shown in FIG. 4, the voltage levels of the first terminals and the second terminals of the transistors in the memory cells 20$x$ ($x$=1 to m) are equal to the ground voltage GND in the pre-discharge period.

Next, step 304 transforms the voltage level of the first terminal of the $n^{th}$ transistor into a source voltage S and the voltage level of the second terminal of the $n^{th}$ transistor into a drain voltage D, and transforms the voltage level of the second terminal of the $(n+1)^{th}$ transistor into an isolation voltage ISO in the $n^{th}$ reading period, wherein n is a positive integer smaller than m. As correspondingly shown in FIG. 4, the voltage level of the first terminal of the transistor of the memory cell 201 is transformed into the source voltage S, the voltage level of the second terminal of the transistor of the memory cell 201 is transformed into the drain voltage D, and the voltage level of the second terminal of the transistor of the memory cell 202 is transformed into the isolation voltage ISO in the first reading period.

Similarly, the voltage level of the first terminal of the transistor of the memory cell 20$n$ is transformed into the source voltage S in the $n^{th}$ reading period, the voltage level of the second terminal of the transistor of the memory cell 20$n$ is transformed into the drain voltage D, and the voltage level of the second terminal of the transistor of the memory cell 20$(n+1)$ is transformed into the isolation voltage ISO. The source voltage S is substantially equal to the ground voltage GND, so the voltage level of the first terminal of the transistor of the memory cell 20$n$ is equal to the ground voltage GND in the $(n+1)^{th}$ reading period, such that the residual charges are cleared without performing the discharge step.

In addition, step 304 transforms the voltage levels of the first terminal and the second terminal of the $n^{th}$ transistor into the voltage levels for substantially reading the data stored in the $n^{th}$ transistor (memory cell 20$n$). The isolation voltage substantially approximates the drain voltage D. The $n^{th}$ transistor (memory cell 20$n$) is isolated from the $(n+2)^{th}$ transistor (memory cell 20$(n+2)$) through the $(n+1)^{th}$ transistor (memory cell 20$(n+1)$), thereby solving the problem of the leakage current.

Then, step 306 transforms the voltage level of the first terminal of the $m^{th}$ transistor into the source voltage S and the voltage level of the second terminal of the $m^{th}$ transistor into the drain voltage D in the $m^{th}$ reading period. As correspondingly shown in FIG. 4, the voltage level of the first terminal of the transistor of the memory cell 20$m$ is transformed into the source voltage S, and the voltage level of the second terminal of the transistor of the memory cell 20$m$ is transformed into the drain voltage D in the $m^{th}$ reading period. Thereafter, step 308 transforms the voltage level of the second terminal of the $m^{th}$ transistor into the ground voltage GND in the discharge period (i.e., after all memory cells have been read).

As correspondingly shown in FIG. 4, the voltage level of the second terminal of the transistor of the memory cell 20$m$ is transformed into the ground voltage GND in the discharge period. Because the source voltage S is substantially equal to the ground voltage GND, all memory cells 20$x$ ($x$=1 to m) are substantially in the states the same as those of the pre-discharge period. In the method of sequentially accessing the memory, the memory cell 20$m$ is not discharged in the discharge period until all the memory cells 201 to 20$m$ have been read. Compared with the prior art method, (m−1) discharge periods are saved.

Figure 5:
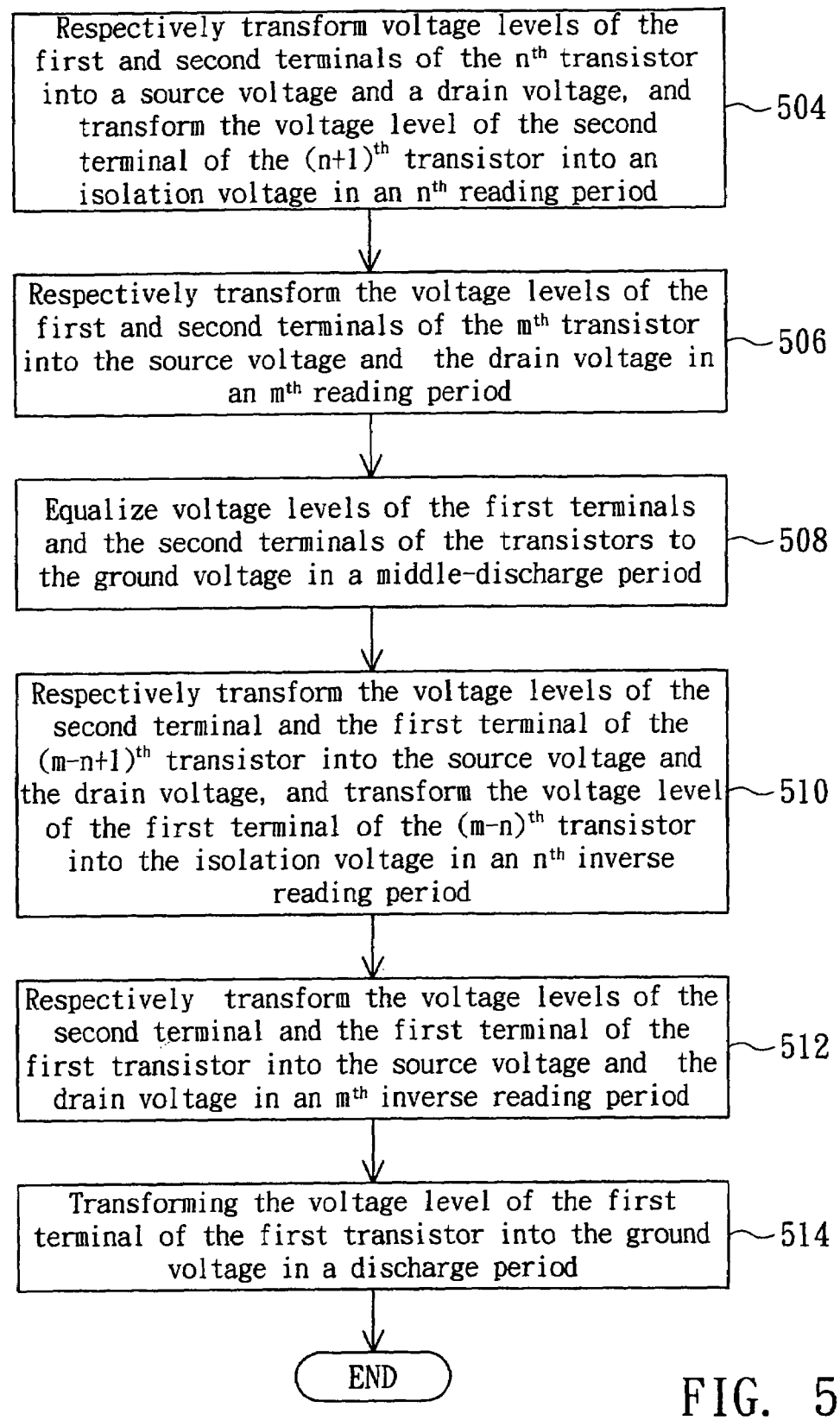
FIG. 5 is a flow chart showing another example for sequentially accessing the memory according to the preferred embodiment of the invention.

Besides, if each of the transistors of the memory cells 201~20$m$ has a first bit and a second bit, the transistor can read the two bits by the method this invention disclosed. FIG. 5 is a flow chart showing another example for sequentially accessing the memory according to the preferred embodiment of the invention. FIG. 6 shows states in another example of the method for sequentially accessing the memory cells 20$x$ ($x$=1 to m) according to the preferred embodiment of the invention. In FIG. 5, steps 502-506 are used to read data stored in the first bits of the memory cells 201~20$m$. The operation principle of steps 502~506 is the same as that of steps 302~306 and not repeated here.

Step 508 equalizes voltage levels of the first terminals and the second terminals of the transistors to the ground voltage GND in the middle-discharge period (i.e., after all first bits of the memory cells have been read). Then step 510 transforms the voltage level of the second terminal of the $(m-n+1)^{th}$ transistor into the source voltage S and the voltage level of the first terminal of the $(m-n+1)^{th}$ transistor into the drain voltage D, and transforms the voltage level of the first terminal of the $(m-n)^{th}$ transistor into the isolation voltage ISO in the $n^{th}$ inverse reading period, wherein n is a positive integer smaller than m. As shown in FIG. 6, the voltage level of the second terminal of the transistor of the memory cell 20$m$ is transformed into the source voltage S, the voltage level of the first terminal of the transistor of the memory cell 20$m$ is transformed into the drain voltage D, and the voltage level of the first terminal of the transistor of the memory cell 20$(m-1)$ is transformed into the isolation voltage ISO in the first inverse reading period.

Similarly, the voltage level of the second terminal of the transistor of the memory cell 20$(m-n+1)$ is transformed into the source voltage S, the voltage level of the first terminal of the transistor of the memory cell 20(m−n+1) is transformed into the drain voltage D, and the voltage level of the first terminal of the transistor of the memory cell 20(m−n) is transformed into the isolation voltage ISO in the n$^{th}$ inverse reading period. Then, step 512 transforms the voltage level of the second terminal of the first transistor into the source voltage S and the voltage level of the first terminal of the first transistor into the drain voltage D in the m$^{th}$ inverse reading period. As correspondingly shown in FIG. 6, the voltage level of the second terminal of the transistor of the memory cell 201 is transformed into the source voltage S and the voltage level of the first terminal of the transistor of the memory cell 201 is transformed into the drain voltage D in the m$^{th}$ inverse reading period. Thereafter, step 514 transforms the voltage level of the first terminal of the first transistor into the ground voltage GND in the discharge period after all transistors have been inverse read.

As correspondingly shown in FIG. 6, the voltage level of the first terminal of the transistor of the memory cell 201 is transformed into the ground voltage GND in the discharge period. Because the source voltage S is substantially equal to the ground voltage GND, all memory cells 20x (x=1 to m) are substantially in the states the same as those of the pre-discharge period. In the method of sequentially accessing the memory mentioned above, the memory cell 201 and the memory cell 20m are respectively discharged once until all first bits and second bits of the memory cells 201 to 20m have been read. Compared with the prior art method, (2m−2) discharge periods are saved.

Figure 7:
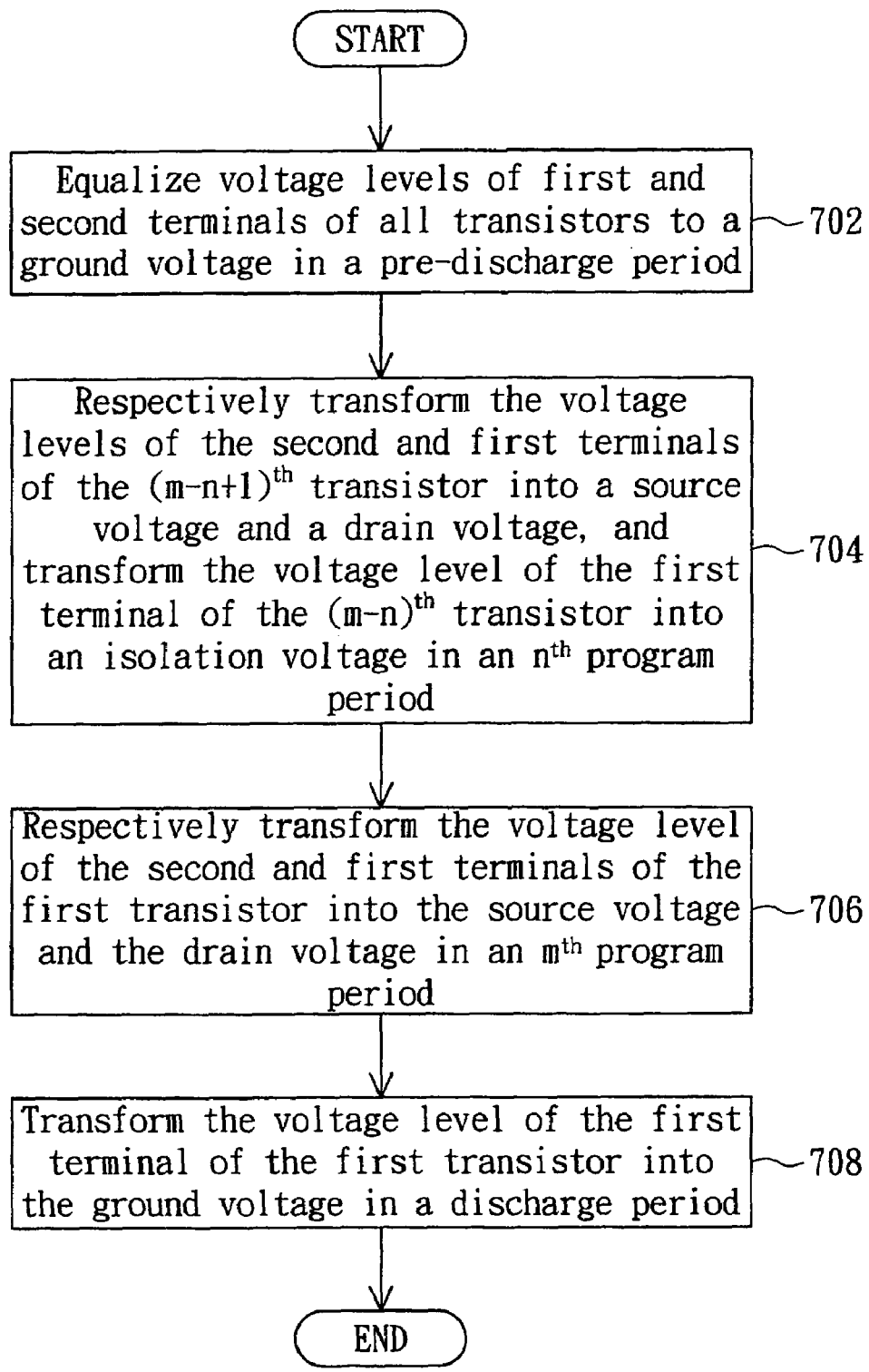
FIG. 7 is a flow chart showing other example for sequentially accessing the memory according to the preferred embodiment of the invention.
Figure 8:
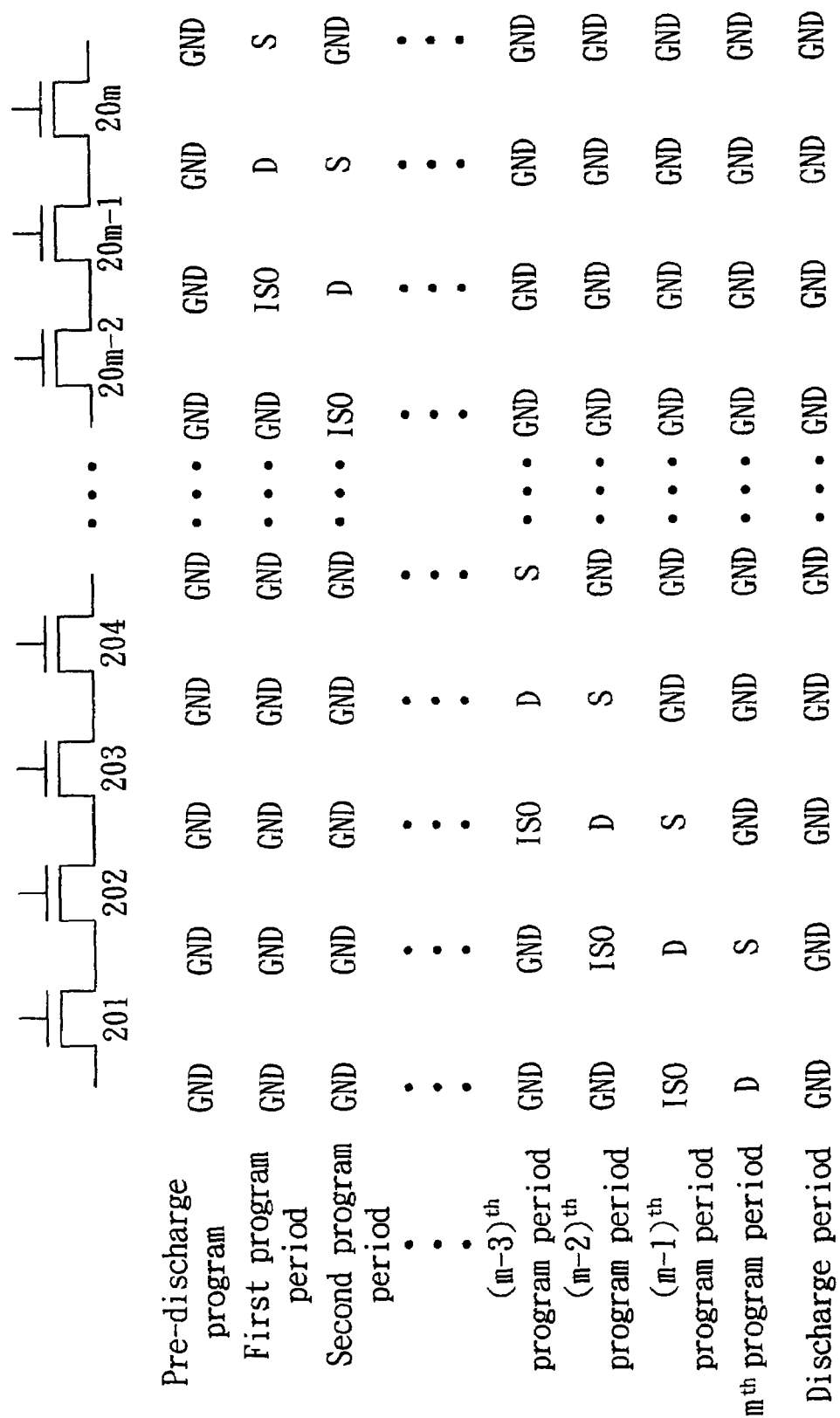
FIG. 8 shows states in other example of the method for sequentially accessing the memory cells 20$x$ ($x$=1 to m) according to the preferred embodiment of the invention.

FIG. 7 is a flow chart showing other example for sequentially accessing the memory according to the preferred embodiment of the invention. FIG. 8 shows states in other example of the method for sequentially accessing the memory cells 20x (x=1 to m) according to the preferred embodiment of the invention. First, step 702 equalizes the voltage levels of the first terminals and the second terminals of all the transistors in the memory cells 20x (x=1 to m) to the ground voltage GND in the pre-discharge period. As correspondingly shown in FIG. 6, the voltage levels of the first terminals and the second terminals of the transistors in the memory cells 20x (x=1 to m) are equal to the ground voltage GND in the pre-discharge period.

Next, step 704 transforms the voltage level of the second terminal of the (m−n+1)$^{th}$ transistor into the source voltage S and the voltage level of the first terminal of the (m−n+1)$^{th}$ transistor into the drain voltage D, and transforms the voltage level of the first terminal of the (m−n)$^{th}$ transistor into the isolation voltage ISO in the n$^{th}$ program period, wherein n is a positive integer smaller than m. As shown in FIG. 8, the voltage level of the second terminal of the transistor of the memory cell 20m is transformed into the source voltage S, the voltage level of the first terminal of the transistor of the memory cell 20m is transformed into the drain voltage D, and the voltage level of the first terminal of the transistor of the memory cell 20(m−1) is transformed into the isolation voltage ISO in the first program period.

Similarly, the voltage level of the second terminal of the transistor of the memory cell 20(m−n+1) is transformed into the source voltage S, the voltage level of the first terminal of the transistor of the memory cell 20(m−n+1) is transformed into the drain voltage D, and the voltage level of the first terminal of the transistor of the memory cell 20(m−n) is transformed into the isolation voltage ISO in the n$^{th}$ program period. The source voltage S is substantially equal to the ground voltage GND, so the residual charges can be cleared without performing the discharge step.

In addition, step 704 transforms the voltage levels of the first terminal and the second terminal of the (m−n+1)$^{th}$ transistor into the voltage levels for substantially programming the (m−n+1)$^{th}$ transistor (memory cell 20(m−n+1)). The isolation voltage GND substantially approximates the drain voltage D. The (m−n+1)$^{th}$ transistor (memory cell 20(m−n+1)) is isolated from the (m−n−1)$^{th}$ transistor (memory cell 20(m−n−1)) through the (m−n)$^{th}$ transistor (memory cell 20(m−n)), and the problem of the leakage current is thus solved.

Then, step 706 transforms the voltage level of the second terminal of the first transistor into the source voltage S and the voltage level of the first terminal of the first transistor into the drain voltage D in the m$^{th}$ program period. As correspondingly shown in FIG. 8, the voltage level of the second terminal of the transistor of the memory cell 201 is transformed into the source voltage S and the voltage level of the first terminal of the transistor of the memory cell 201 is transformed into the drain voltage D in the m$^{th}$ program period. Thereafter, step 708 transforms the voltage level of the first terminal of the first transistor into the ground voltage GND in the discharge period after all transistors have been programmed.

As correspondingly shown in FIG. 8, the voltage level of the first terminal of the transistor of the memory cell 201 is transformed into the ground voltage GND in the discharge period. Because the source voltage S is substantially equal to the ground voltage GND, all memory cells 20x (x=1 to m) are substantially in the states the same as those of the pre-discharge period. In the method of sequentially accessing the memory, the memory cell 201 is not discharged in the discharge period until all the memory cells 201 to 20m have been programmed. Compared with the prior art method, (m−1) discharge periods are saved.

Figure 9:
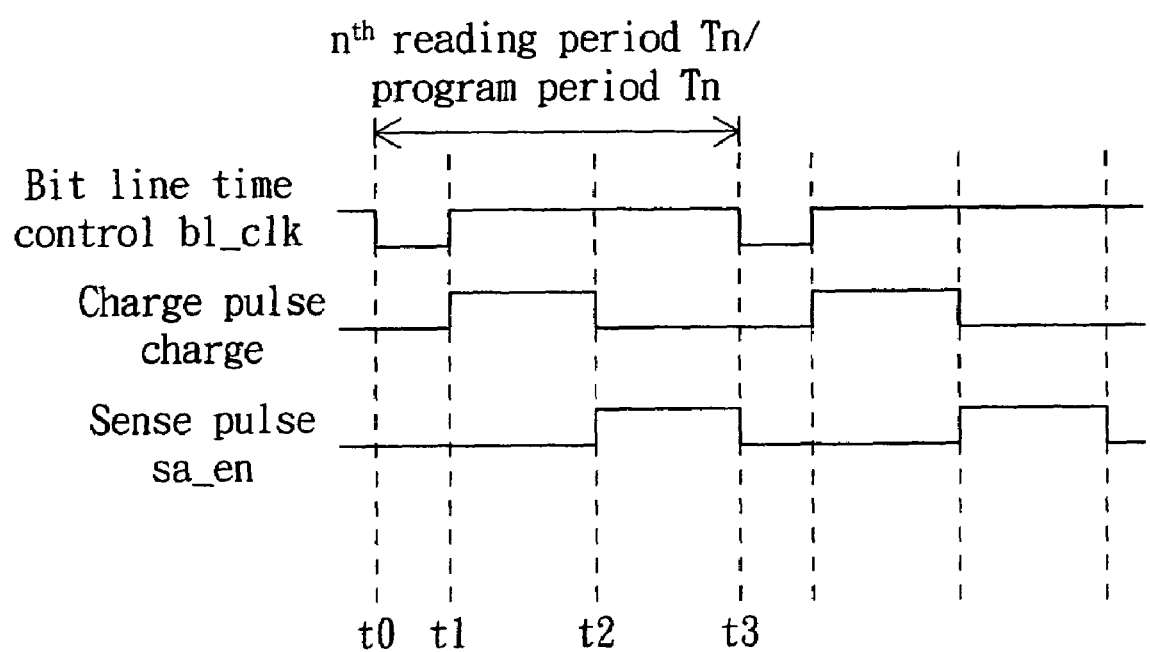
FIG. 9 is a timing chart showing the method for sequentially accessing the memory according to the preferred embodiment of the invention.

FIG. 9 is a timing chart showing the method for sequentially accessing the memory according to the preferred embodiment of the invention. In the example of FIG. 9, the memory cell 20n is accessed. Before the memory operates, the voltage levels the first terminals and the second terminals of the transistors of all the memory cells are pulled down to a low level voltage (i.e., a ground voltage) in the pre-discharge period (not shown). In the n$^{th}$ read/program period Tn, the voltage level of the bit line timing control bl_clk of the bit line corresponding to the memory cell 20n is equal to the low level voltage between the time instants t0 and t1. At this time, the memory cell 20n does not operate. Thereafter, the voltage level thereof is equal to the high level voltage between the time instants t1 and t4 and the memory cell 20n is being read/programmed.

Then, the memory cell 20n is charged and the voltage level of the charge pulse "charge" is transformed into the high level voltage in the charge period between the time instants t1 and t2. Next, the memory cell 20n is sensed in the sense period between the time instants t2 and t3, wherein the voltage level of the sense pulse sa_en is transformed into the high level voltage. Obviously, compared with the prior art method, the discharge period is saved.

In addition, if all the memory cells are to be programmed in dual bits, similar to that shown in FIG. 5 and FIG. 6, only one time of discharge operation has to be performed between the operations of programming the left bit and the right bit of the memory cell 20m when the memory cell 20m is to be programmed. Compared with the prior art method, a lot of operation time is saved. When the memory is to be verified and if the verification error occurs and the memory has to be read or programmed again, only one discharge period has to be spent such that the saved operation time is very long and the memory can operate at the high speed and the operation power can be reduced.

In the sequential memory and the accessing method thereof according to the embodiment of the invention, no discharge period will be spent in the access period when the memory cells of the sequential memory are being accessed, and only one discharge period is spent in the access process. Thus, the operation time is greatly saved, the memory can operate at the high speed and the operation power can be reduced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for sequentially accessing a memory having (m+1) bit lines and at least one row of transistors, wherein m is a positive integer, the at least one row of transistors comprises m transistors, the $x^{th}$ transistor has a first terminal coupled to the $x^{th}$ bit line and a second terminal coupled to the $(x+1)^{th}$ bit line, and x is a positive integer smaller than or equal to m, the method comprising the steps of:

equalizing voltage levels of the first terminals and the second terminals of the transistors to a ground voltage in a pre-discharge period;

transforming the voltage level of the first terminal of the $n^{th}$ transistor into a source voltage, transforming the voltage level of the second terminal of the $n^{th}$ transistor into a drain voltage, and transforming the voltage level of the second terminal of the $(n+1)^{th}$ transistor into an isolation voltage in an $n^{th}$ reading period, wherein n is a positive integer smaller than m; and transforming the voltage level of the first terminal of the $m^{th}$ transistor into the source voltage, and transforming the voltage level of the second terminal of the $m^{th}$ transistor into the drain voltage in an $m^{th}$ reading period, wherein the source voltage is equal to the ground voltage.

2. The method according to claim 1, wherein the step of transforming the voltage levels of the first terminal and the second terminal of the $n^{th}$ transistor in the $n^{th}$ reading period reads data stored in the $n^{th}$ transistor.

3. The method according to claim 1, wherein the isolation voltage approximates the drain voltage such that the $n^{th}$ transistor is isolated from the $(n+2)^{th}$ transistor through the $(n+1)^{th}$ transistor.

4. The method according to claim 1, further comprising the step of:

transforming the voltage level of the second terminal of the $m^{th}$ transistor into the ground voltage in a discharge period.

5. The method according to claim 1, further comprising the step of:

transforming the voltage level of the first terminal of the first transistor into the ground voltage in a discharge period.

6. The method according to claim 1, further comprising the step of:

transforming the voltage level of the second terminal of the $m^{th}$ transistor into the ground voltage in a discharge period.

7. A sequential memory, comprising:

(m+1) bit lines, wherein m is a positive integer; and at least one row of memory cells having m memory cells, each of which has a transistor, wherein the $x^{th}$ transistor has a first terminal coupled to the $x^{th}$ bit line and a second terminal coupled to the $(x+1)^{th}$ bit line, and x is a positive integer smaller than or equal to m, wherein:

voltage levels of the first terminals and the second terminals of the transistors equal a ground voltage in a pre-discharge period;

the voltage level of the first terminal of the $n^{th}$ transistor is transformed into a source voltage, the voltage level of the second terminal of the $n^{th}$ transistor is transformed into a drain voltage, and the voltage level of the second terminal of the $(n+1)^{th}$ transistor is transformed into an isolation voltage in an $n^{th}$ reading period, wherein n is a positive integer smaller than m;

the voltage level of the first terminal of the $m^{th}$ transistor is transformed into the source voltage, and the voltage level of the second terminal of the $m^{th}$ transistor is transformed into the drain voltage in an $m^{th}$ reading period; and the source voltage is equal to the ground voltage.

8. The memory according to claim 7, wherein the transistors are floating gate field effect transistors.

9. The memory according to claim 7, wherein data stored in the $n^{th}$ memory cell is read in the $n^{th}$ reading period.

10. The memory according to claim 7, wherein the isolation voltage approximates the drain voltage such that the $n^{th}$ transistor is isolated from the $(n+2)^{th}$ transistor through the $(n+1)^{th}$ transistor.

11. The memory according to claim 7, wherein the voltage level of the second terminal of the $m^{th}$ transistor is transformed into the ground voltage in a discharge period.

12. A method for sequentially accessing a memory having (m+1) bit lines and at least one row of transistors, wherein m is a positive integer, the at least one row of transistors has m transistors, the $x^{th}$ transistor has a first terminal coupled to the $x^{th}$ bit line and a second terminal coupled to the $(x+1)^{th}$ bit line, and x is a positive integer smaller than or equal to m, the method comprising the steps of:

equalizing voltage levels of the first terminals and the second terminals of the transistors to a ground voltage in a pre-discharge period;

transforming the voltage level of the second terminal of the $(m-n+1)^{th}$ transistor into a source voltage, transforming the voltage level of the first terminal of the $(m-n+1)^{th}$ transistor into a drain voltage, and transforming the voltage level of the first terminal of the $(m-n)^{th}$ transistor into an isolation voltage in an $n^{th}$ program period, wherein n is a positive integer smaller than m; and transforming the voltage level of the second terminal of the first transistor into the source voltage and transforming the voltage level of the first terminal of the first transistor into the drain voltage in an $m^{th}$ program period, wherein, the source voltage is equal to the ground voltage.

13. The method according to claim 12, wherein the step of transforming the voltage levels of the first terminal and the second terminal of the $(m-n+1)^{th}$ transistor in the $n^{th}$ program period programs the $(m-n+1)^{th}$ transistor.

14. The method according to claim 12, wherein the isolation voltage approximates the drain voltage such that the $(m-n+1)^{th}$ transistor is isolated from the $(m-n-1)^{th}$ transistor through the $(m-n)^{th}$ transistor.

15. The method according to claim 12, further comprising the step of:
- transforming the voltage level of the first terminal of the first transistor into the ground voltage in a discharge period.

16. A sequential memory, comprising:
- (m+1) bit lines, wherein m is a positive integer; and
- at least one row of memory cells having m memory cells, each of which has a transistor, wherein a first terminal of the $x^{th}$ transistor is coupled to the $x^{th}$ bit line, a second terminal of the $x^{th}$ transistor is coupled to the $(x+1)^{th}$ bit line, and x is a positive integer smaller than or equal to m, wherein:
- voltage levels of the first terminals and the second terminals of the transistors equal a ground voltage in a pre-discharge period;
- the voltage level of the second terminal of the $(m-n+1)^{th}$ transistor is transformed into a source voltage, the voltage level of the first terminal of the $(m-n+1)^{th}$ transistor is transformed into a drain voltage, and the voltage level of the first terminal of the $(m-n)^{th}$ transistor is transformed into an isolation voltage in an $n^{th}$ program period, wherein n is a positive integer smaller than m;
- the voltage level of the second terminal of the first transistor is transformed into the source voltage, and the voltage level of the first terminal of the first transistor is transformed into the drain voltage in an $m^{th}$ reading period; and
- the source voltage is equal to the ground voltage.

17. The memory according to claim 16, wherein the transistors are floating gate field effect transistors.

18. The memory according to claim 16, wherein the $(m-n+1)^{th}$ memory cell is programmed in the $n^{th}$ program period.

19. The memory according to claim 16, wherein the isolation voltage approximates the drain voltage such that the $(m-n+1)^{th}$ transistor is isolated from the $(m-n-1)^{th}$ transistor through the $(m-n)^{th}$ transistor.

20. The memory according to claim 16, wherein the voltage level of the first terminal of the first transistor is transformed into the ground voltage in a discharge period.

21. A method for sequentially accessing a memory having (m+1) bit lines and at least one row of transistors, wherein m is a positive integer, the at least one row of transistors comprises m transistors, the $x^{th}$ transistor has a first terminal coupled to the $x^{th}$ bit line and a second terminal coupled to the $(x+1)^{th}$ bit line, and x is a positive integer smaller than or equal to m, the $x^{th}$ transistor has a first bit and a second bit, the method comprising the steps of:
- equalizing voltage levels of the first terminals and the second terminals of the transistors to a ground voltage in a pre-discharge period;
- transforming the voltage level of the first terminal of the $n^{th}$ transistor into a source voltage, transforming the voltage level of the second terminal of the $n^{th}$ transistor into a drain voltage, and transforming the voltage level of the second terminal of the $(n+1)^{th}$ transistor into an isolation voltage in an $n^{th}$ reading period, wherein n is a positive integer smaller than m;
- transforming the voltage level of the first terminal of the $m^{th}$ transistor into the source voltage, and transforming the voltage level of the second terminal of the $m^{th}$ transistor into the drain voltage in an $m^{th}$ reading period;
- equalizing voltage levels of the first terminals and the second terminals of the transistors to the ground voltage in a middle-discharge period;
- transforming the voltage level of the second terminal of the $(m-n+1)^{th}$ transistor into the source voltage, transforming the voltage level of the first terminal of the $(m-n+1)^{th}$ transistor into the drain voltage, and transforming the voltage level of the first terminal of the $(m-n)^{th}$ transistor into the isolation voltage in an $n^{th}$ inverse reading period; and
- transforming the voltage level of the second terminal of the first transistor into the source voltage and transforming the voltage level of the first terminal of the first transistor into the drain voltage in an $m^{th}$ inverse reading period;
- wherein, the source voltage is equal to the ground voltage.

22. The method according to claim 21, wherein the step of transforming the voltage levels of the first terminal and the second terminal of the $n^{th}$ transistor in the $n^{th}$ reading period reads data stored in the first bit of the $n^{th}$ transistor.

23. The method according to claim 21, wherein the step of transforming the voltage levels of the first terminal and the second terminal of the $(m-n+1)^{th}$ transistor in the $n^{th}$ inverse reading period reads data stored in the second bit of the $(m-n+1)^{th}$ transistor.

24. The method according to claim 21, wherein the isolation voltage approximates the drain voltage such that the $n^{th}$ transistor is isolated from the $(n+2)^{th}$ transistor through the $(n+1)^{th}$ transistor.

25. The method according to claim 21, wherein the isolation voltage approximates the drain voltage such that the $(m-n+1)^{th}$ transistor is isolated from the $(m-n-1)^{th}$ transistor through the $(m-n)^{th}$ transistor.

26. The method according to claim 21, wherein the isolation voltage approximates the drain voltage such that the $n^{th}$ transistor is isolated from the $(n+2)^{th}$ transistor through the $(n+1)^{th}$ transistor.

27. The method according to claim 21, wherein the isolation voltage approximates the drain voltage such that the $(m-n+1)^{th}$ transistor is isolated from the $(m-n-1)^{th}$ transistor through the $(m-n)^{th}$ transistor.

28. A method for sequentially accessing a memory having (m+1) bit lines and at least one row of transistors, wherein m is a positive integer, the at least one row of transistors comprises m transistors, the $x^{th}$ transistor has a first terminal coupled to the $x^{th}$ bit line and a second terminal coupled to the $(x+1)^{th}$ bit line, and x is a positive integer smaller than or equal to m, the $x^{th}$ transistor has a first bit and a second bit, the method comprising the steps of:
- equalizing voltage levels of the first terminals and the second terminals of the transistors to a ground voltage in a pre-discharge period;
- transforming the voltage level of the second terminal of the $(m-n+1)^{th}$ transistor into a source voltage, transforming the voltage level of the first terminal of the $(m-n+1)^{th}$ transistor into a drain voltage, and transforming the voltage level of the first terminal of the $(m-n)^{th}$ transistor into an isolation voltage in an $n^{th}$ program period;
- transforming the voltage level of the second terminal of the first transistor into the source voltage and transforming the voltage level of the first terminal of the first transistor into the drain voltage in an $m^{th}$ program period, wherein n is a positive integer smaller than m;
- equalizing voltage levels of the first terminals and the second terminals of the transistors to the ground voltage in a middle-discharge period;
- transforming the voltage level of the first terminal of the $n^{th}$ transistor into the source voltage, transforming the voltage level of the second terminal of the $n^{th}$ transistor into the drain voltage, and transforming the voltage level of the second terminal of the $(n+1)^{th}$ transistor into the isolation voltage in an $n^{th}$ inverse program period; and transforming the voltage level of the first terminal of the $m^{th}$ transistor into the source voltage, and transforming the voltage level of the second terminal of the $m^{th}$ transistor into the drain voltage in an $m^{th}$ inverse program period;

wherein, the source voltage is equal to the ground voltage.

29. The method according to claim 28, wherein the step of transforming the voltage levels of the first terminal and the second terminal of the $(m-n+1)^{th}$ transistor in the $n^{th}$ program period programs the first bit of the $(m-n+1)^{th}$ transistor.

30. The method according to claim 28, wherein the step of transforming the voltage levels of the first terminal and the second terminal of the $n^{th}$ transistor in the $n^{th}$ inverse program period programs the second bit of the $n^{th}$ transistor.

* * * * *